United States Patent
Huang et al.

(10) Patent No.: US 8,850,374 B2
(45) Date of Patent: Sep. 30, 2014

(54) METHOD OF REDUCING PARASITIC MISMATCH

(71) Applicant: Taiwan Semiconductor Manufacturing Company, Ltd., Hsin-Chu (TW)

(72) Inventors: Char-Ming Huang, Miaoli (TW); Hui-Yu Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/670,130

(22) Filed: Nov. 6, 2012

(65) Prior Publication Data

US 2014/0130001 A1    May 8, 2014

(51) Int. Cl.
G06F 9/455 (2006.01)
G06F 17/50 (2006.01)

(52) U.S. Cl.
USPC ............. 716/112; 716/52; 716/55; 716/106; 716/107

(58) Field of Classification Search
USPC ............. 716/50–56, 106–108, 110–113
See application file for complete search history.

(56) References Cited

U.S. PATENT DOCUMENTS 5,551,014 A * 8/1996 Yoshida et al. ............. 716/102
2013/0055183 A1 * 2/2013 Beakes et al. ............... 716/111

OTHER PUBLICATIONS

"Predicting the Effects of Error Sources in BandGap Reference Circuits and Evaluating Their Design Implications", by Vishal Gupta and Gabriel A. Rincon-Mora, IEEE @2002.*

* cited by examiner

*Primary Examiner* — Nha Nguyen
(74) *Attorney, Agent, or Firm* — Slater and Matsil, L.L.P.

(57) ABSTRACT

A method of reducing parasitic mismatches comprises generating a first net list file from a first layout through a resistance-inductance-capacitance (RLC) extraction mechanism using a first simulation tool, performing a V/I test on a network through a second simulation tool, determining whether a mismatch exists based upon a result of the V/I test and modifying a connection trace of the network to generate a second layout.

20 Claims, 9 Drawing Sheets

| .SUBCKT resAB B A | | | | |
|---|---|---|---|---|
| | net name | value | metal info | Coordinate |
| R1 | A1:A2 | 2.1403 | $l=0.025 $w=0.05 $lvl=25 | $location=(0,0);(2,0);(0,10);(2,10) |
| R2 | B1:B2 | 2.1304 | $l=0.025 $w=0.05 $lvl=25 | $location=(3.7,0);(5.7,0);(3.7,10);(5.7,10) |
| XXR3 net1 net4 rppoly wo l=3.6u w=1.2u | | | | |
| XXR3 @2 net2 net5 rppoly wo l=3.6u w=1.2u | | | | |
| XXR3 @3 net3 net6 rppoly wo l=3.6u w=1.2u | | | | |
| .ENDS | | | | |

Figure 2

METHOD OF REDUCING PARASITIC MISMATCH

FIELD OF DISCLOSURE

The present disclosure pertains to methods of correcting a resistance ratio mismatch between a pre-layout simulation result and a post layout testing result. More particularly, the present disclosure pertains to correcting a variety of parasitic element induced mismatches in various semiconductor devices.

BACKGROUND

As semiconductor technologies evolve, integrated circuits (IC) have migrated to small feature sizes, such as 65 nanometers, 45 nanometers, 32 nanometers and below. Semiconductor technologies with small feature sizes lead to more interactions between semiconductor fabrication and design. For example, the impact of parasitic effects will become more important for devices with small feature sizes. A variety of simulation and optimization procedures may be performed by IC designers to ensure the devices with small feature sizes meet the performance index to which they are specified.

Semiconductor resistors are widely used in integrated circuits. Semiconductor resistors may be formed by doping an active region of the substrate of an integrated circuit. Alternatively, semiconductor resistors may be formed by depositing a plurality of polysilicon layers formed over the substrate. A semiconductor resistor may be formed by a plurality of resistor components connected in series or parallel. For example, the resistor components of a semiconductor resistor may be doped active regions formed in the substrate. A variety of interconnect structures connect the resistor components together to form the semiconductor resistor.

Semiconductor resistors may be employed to form critical control circuits of integrated circuits. For example, in a band gap reference circuit, the reference voltage is determined by a ratio of two semiconductor resistors coupled to the band gap reference circuit. As such, the ratio of these two semiconductor resistors is critical for maintaining accurate operations so that the band gap reference circuit may be able to generate an accurate reference voltage.

The layout of semiconductor resistors may cause a plurality of resistance variations due to parasitic parameters contributed by interconnects, which are used to couple different resistor components. Such variations may cause a shift of the ratio between two semiconductor resistors. As such, some critical performance indexes such as timing, noise and reliability may be negatively affected.

Various Electronic Design Automation (EDA) tools may be used to extract parasitic capacitance, inductance and resistance. For example, EDA tools such as Star-RCXT from SYNOPSYS, CALIBRE from Mentor Graphics and/or the like may first receive a SPICE model file from an IC foundry and extract parasitic parameters subsequently.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates an exemplary format of a net list file in accordance with an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, methods of correcting a resistance ratio mismatch between a pre-layout simulation result and a post layout testing result. The invention may also be applied, however, to correcting a variety of parasitic element induced mismatches in various semiconductor devices. Hereinafter, various embodiments will be explained in detail with reference to the accompanying drawings.

Figure 1:
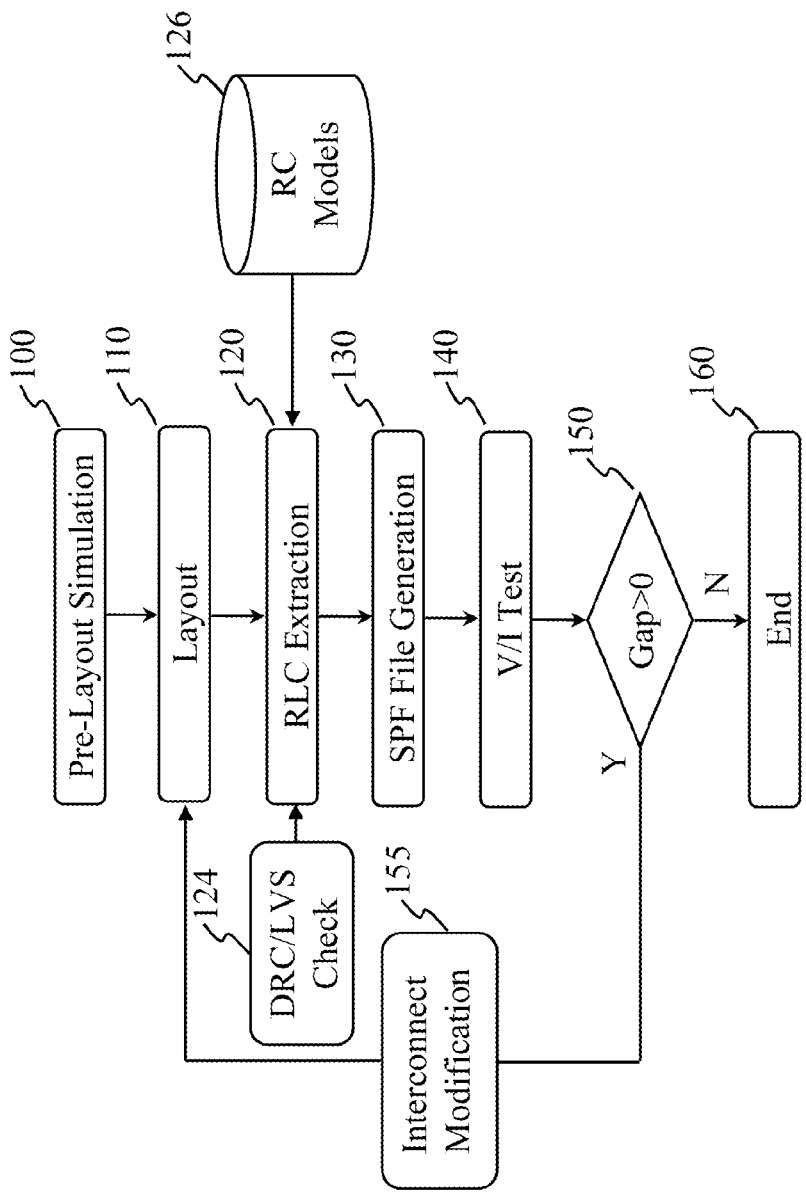
FIG. 1 illustrates a flowchart including a sequence of steps for correcting a mismatch between a per-layout simulation result and a post-layout testing result in accordance with an embodiment.

FIG. 1 illustrates a flowchart including a sequence of steps for correcting a mismatch between a per-layout simulation result and a post-layout testing result in accordance with an embodiment. At step 100, integrated circuit design is completed. In accordance with an embodiment, the integrated circuit may comprise a band gap reference circuit (not shown but illustrated in FIG. 8). In order to maintain a high performance and accurate reference voltage, the design requires a fixed ratio between some resistors (e.g., R1 and R2 illustrated in FIG. 8), which may be used to set the constant current source of the band gap reference.

A pre-layout simulation has been performed on the band gap reference circuit. Through the simulation, a critical specification including a ratio between two semiconductor resistors has been verified.

At step 110, and initial integrated circuit layout is created. The semiconductor resistors R1 and R2 (not shown) of the band gap reference may be formed by a plurality of semiconductor resistors and various interconnect structures coupled between the semiconductor resistors R1 and R2. As known in the art, the interconnect structures such as metal lines in different metal layers may cause parasitic parameters including parasitic resistance, parasitic capacitance and/or the like.

At step 120, resistance-inductance-capacitance (RLC) data may be generated based upon component models provided by an IC foundry. In accordance with an embodiment, the IC foundry inputs semiconductor models. More particularly, the thickness, width and spacing of the interconnect conductors of the schematic may be provided so that the parasitic parameters including parasitic resistance can be obtained. An Electronic Design Automation (EDA) tool such as Star-RCXT from SYNOPSYS, CALIBRE from Mentor Graphics, QRC, QUICK-CAP and/or the like may be employed to extract parasitic parameters.

At step 124, two major checks may be performed on the layout. The first check is a design rule check (DRC). The DRC check is used to ensure the routing process of the layout is correct according to the layout requirements of one particular process node. The common DRC check includes shorts, spacing violations and/or the like. The second check is a layout versus schematic (LVS) check. During a LVS check, the schematic is extracted from the layout and compared with the original schematic prior to the layout.

At step 130, a net list file is generated based upon the parasitic extraction results of step 120. In accordance with an embodiment, the net list file may be of a format modified from a standard parasitic format (SPF) file. As a result, the format of the net list file may be different from the conventional SPF file. The detailed format of the net list file will be described below with respect to FIG. 2.

At step 140, It is noted that, in order to obtain accurate values of the post-layout parasitic parameters, a V-I test may be employed to verify the post layout parasitic parameters. For example, a resistance ratio of two semiconductor resistors R1 and R2 may vary in consideration with parasitic resistance caused by interconnects. In order to obtain accurate post-layout resistance values, a V-I test may be applied to the resistor networks (e.g., R1 and R2 formed by resistor networks) so that the total resistance including parasitic resistance from interconnects may be accurately assessed. The detailed process of the V-I test will be described below with respect to FIG. 3A and FIG. 3B.

One advantageous feature of having a V-I test is that the parasitic parameters such as parasitic resistance, capacitance and inductance may be extracted from the data of a SPF file without performing a post layout simulation. As such, the cost and time for designing a high performance circuit may be reduced.

At step 150, if parasitic parameters cause undesirable performance such as a change of the ratio of R1 and R2, the mismatch correction method proceeds with step 155. On the other hand, if the V-I test shows the ratio of R1 and R2 can satisfy the design specification, the design process is completed at step 160.

At step 155, in order to compensate the parasitic resistance caused by interconnects, the layout may be modified. In accordance with an embodiment, the width and length of interconnects may be modified so that the ratio of the semiconductor resistors R1 and R2 can be maintained. The detailed process of modifying the layout will be described below with respect to FIGS. 4-6.

It should be noted that while FIG. 1 illustrate a method for correcting a mismatch between a pre-layout simulation result and a post layout testing result, a person having ordinary skill in the art will recognize the flowchart is merely an example. There may be many alternatives. For example, various step as illustrated in FIG. 1 may added, removed, replaced, rearranged, repeated, overlapped, and/or partially overlapped.

FIG. 2 illustrates an exemplary format of a net list file in accordance with an embodiment. The net list file 200 includes resistance values of a plurality of resistor networks. It should be noted that the net list file 200 is based upon but different from a conventional SPF file. As shown in FIG. 2, a dashed rectangle 202 includes two semiconductor resistors and their corresponding parameters.

The item "R1 A1:A2 2.1403 1=0.025 w=0.05" represents that the resistor R1 is located between nodes A1 and A2. The resistor R1 is about 2.1403 ohms. In addition, the physical size of the resistor R1 includes a width of about 0.05 um and a length of about 0.025 um.

The item "(0, 0); (2, 0); (0, 10); (2, 10)" represents the (x,y) location of the resistor R1 on a layout. In accordance with various embodiments, the resistor R1 may be rectangular in shape. The four corners of the rectangle may be of coordinates (0, 0), (2, 0), (0, 10) and (2, 10) respectively.

The portion of the net list file 200 regarding the resistor R2 is similar to that of the resistor R1, and hence is discussed in detail herein to avoid repetition. One advantageous feature of having the net list file shown in FIG. 2 is that the net list file not only shows the lump resistance values of semiconductor resistors, but also illustrates the (x,y) locations of the semiconductor resistors. As such, the mismatch between two different resistor networks can be quickly detected and fixed accordingly.

Figure 3A:
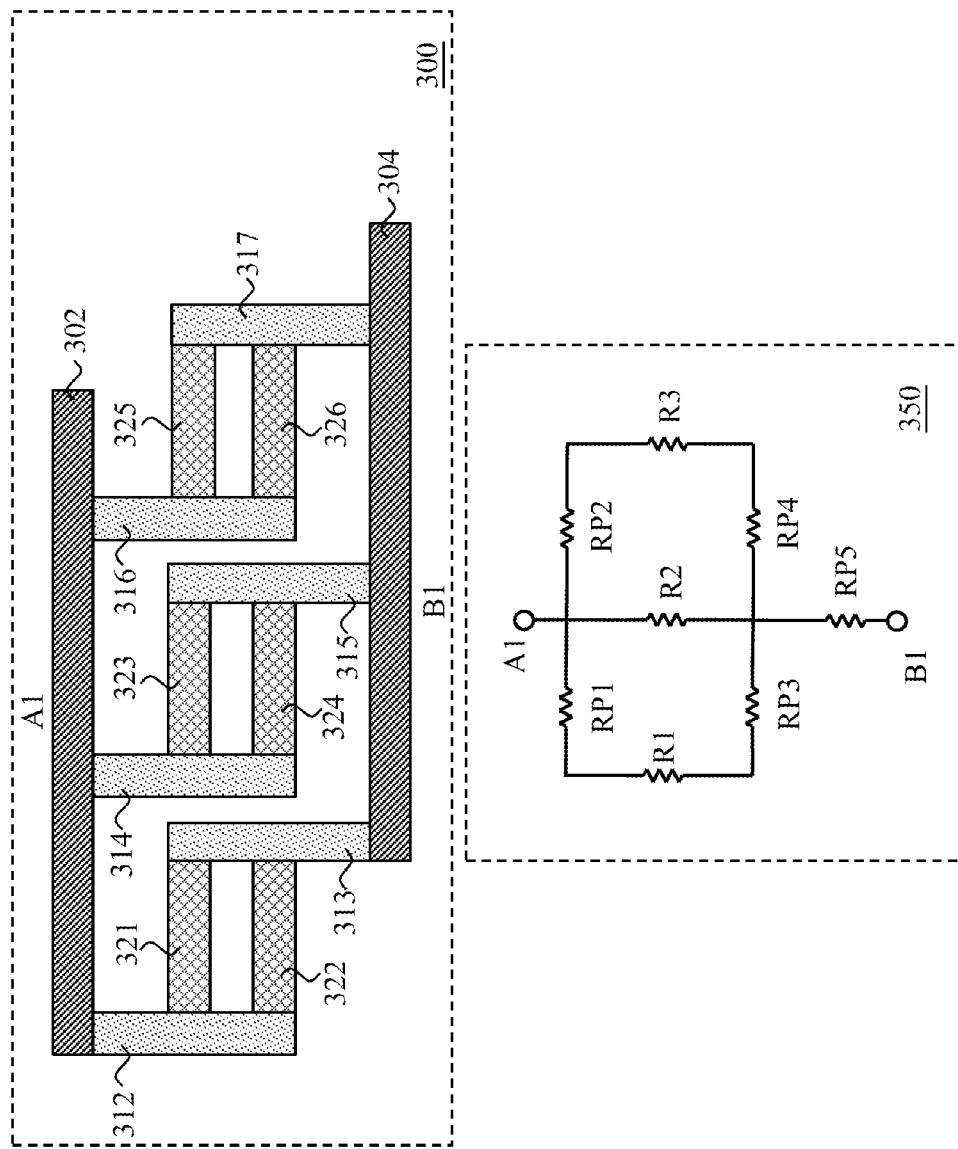
FIG. 3A illustrates a semiconductor structure and its equivalent circuit in accordance with an embodiment.

FIG. 3A illustrates a semiconductor structure and its equivalent circuit in accordance with an embodiment. The semiconductor structure 300 comprises a plurality of semiconductor resistors connected in parallel. As shown in FIG. 3A, the semiconductor resistors 321 and 322 are connected in parallel. Likewise, the semiconductor resistors 323 and 324 are connected in parallel and the semiconductor resistors 325 and 326 are connected in parallel.

The aforementioned semiconductors may be polysilicon resistors. According to an embodiment, a polysilicon resistor may be formed by using a plurality of polysilicon layers formed over a semiconductor substrate. Alternative, the semiconductor resistors 321, 322, 323, 324, 325 and 326 may be formed doping of a portion of the active region of a substrate. By controlling the doping density, the desired resistance of the semiconductor resistors can be achieved.

It should be noted that while FIG. 3A illustrates three groups of semiconductor resistors connected in parallel, the number of semiconductor resistors illustrated herein is limited solely for the purpose of clearly illustrating the inventive aspects of the various embodiments. The various embodiments of this disclosure are not limited to any specific number of semiconductor resistors.

The semiconductor resistors 321, 322, 323, 324, 325 and 326 are connected to each other through a plurality of interconnects located in different metal layers such as the first metal layer M1, the second metal layer M2 and the like. In accordance with an embodiment, interconnects 312, 313, 314, 315, 316 and 317 may be formed in the first metal layer M1. Interconnects 302 and 304 may be formed in the second metal layer M2. As shown in FIG. 2, the first metal layer interconnects couple two semiconductor resistors together to form three resistor pairs. Furthermore, the second metal layer interconnects connect these three resistor pairs in parallel.

The equivalent circuit 350 shows the circuit diagram of the semiconductor structure 300 after considering parasitic parameters induced by the first metal layer interconnects (e.g., 321) and the second metal layer interconnects (e.g., 302). As shown in FIG. 3A, R1 is formed by resistor 321 and resistor 322 connected in parallel. Likewise, R2 is formed by resistor 323 and resistor 324 connected in parallel. R3 is formed by resistor 325 and resistor 326 connected in parallel. The second metal layer interconnect 302 may induce two parasitic resistors RP1 and RP2 as shown in FIG. 3A. Similarly, the second metal layer interconnect 304 may induce two parasitic resistors RP3 and RP4. The parasitic resistance contributed by the first metal layer interconnects 312, 313, 314, 315, 316 and 317 may be equivalent to a resistor RP5 as shown in FIG. 3A.

The accurate value of the equivalent circuit 350 may be obtained by a V-I test applied to the equivalent circuit 350. In accordance with an embodiment, the equivalent circuit is provided to an EDA tool such as HSPICE in order to obtain accurate post-layout resistance values. The voltage/current characterization data of the equivalent circuit 350 can be calculated by applying a voltage across the two terminals A1 and B1 of the equivalent circuit 350, measuring a current flowing through the equivalent circuit 350 and calculating the accurate resistance value based upon the voltage and the current. The EDA tool HSPICE may report the calculated resistance value accordingly.

One advantageous feature of performing a V-I test on the equivalent circuit 350 is that a lump resistance value of the equivalent circuit 350 can be obtain. Such a lump resistance value includes a variety of parasitic resistors (e.g., RP1, RP2, RP3, RP4 and RP5) caused by interconnects. An accurate resistance ratio may be calculated based upon this lump resistance value.

It should be noted that the resistance network shown in FIG. 3A is merely an exemplary network and is not meant to limit the current embodiments. Other circuits, such as capacitor networks, inductor networks, any combinations thereof, may alternatively be used. Any suitable circuits may be used, and all such circuits are fully intended to be included within the scope of the embodiments discussed herein.

Referring back to FIG. 2, the net list file 200 includes lump resistance values between different nodes of a circuit. As such, a selected resistor structure may be modified if the parasitic resistance from the resistor structure causes an undesirable ratio between two semiconductor resistors.

Figure 3B:
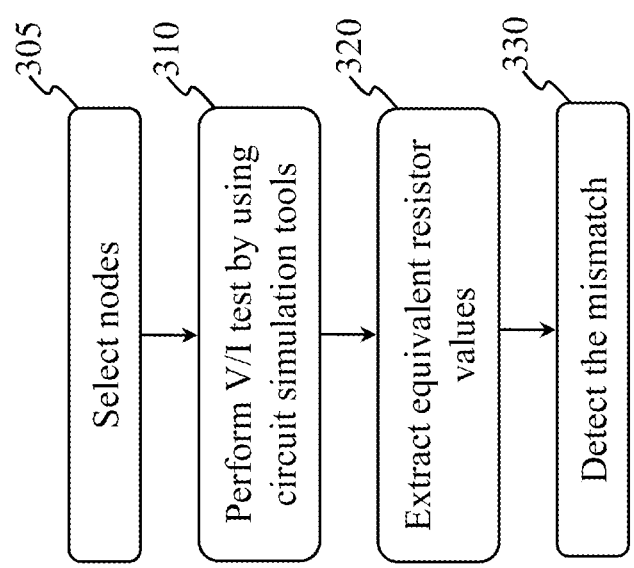
FIG. 3B illustrates a flowchart of performing a V/I test in accordance with various embodiments of the present disclosure.
Figure 4:
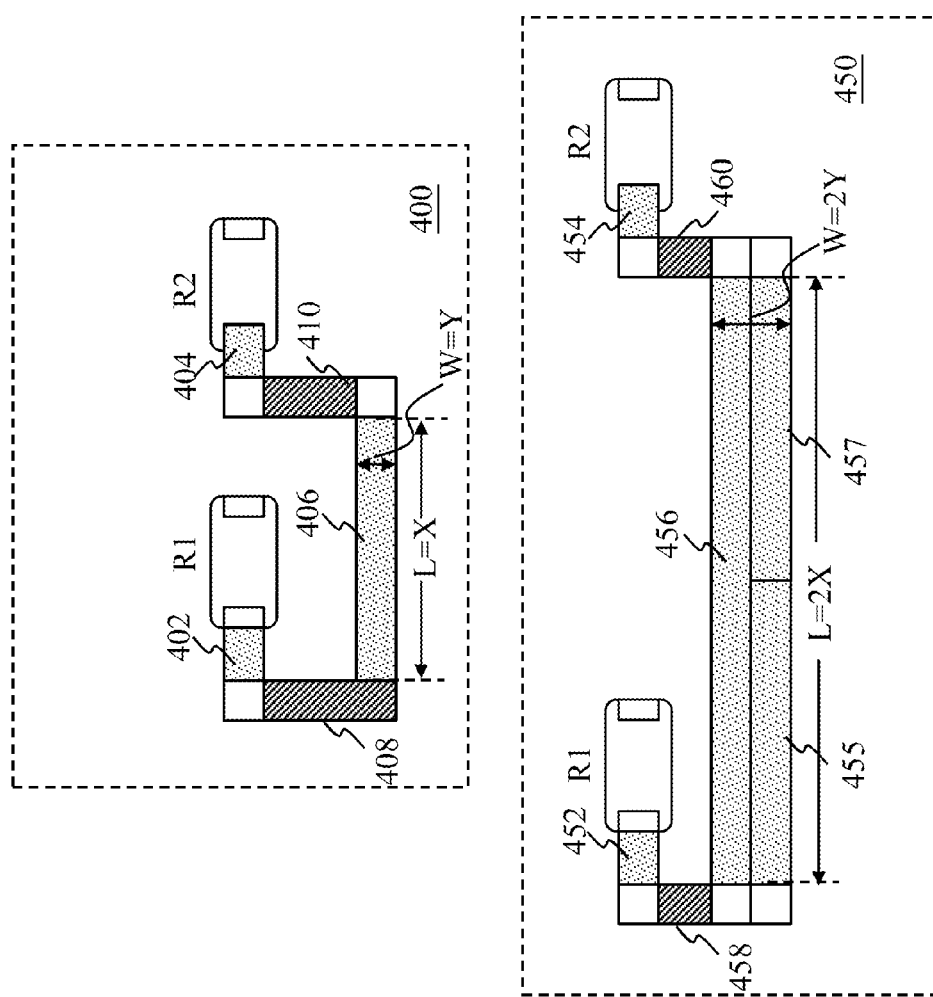
FIG. 4 illustrates a method of adjusting the resistance of a semiconductor resistor structure in accordance with an embodiment.
Figure 5:
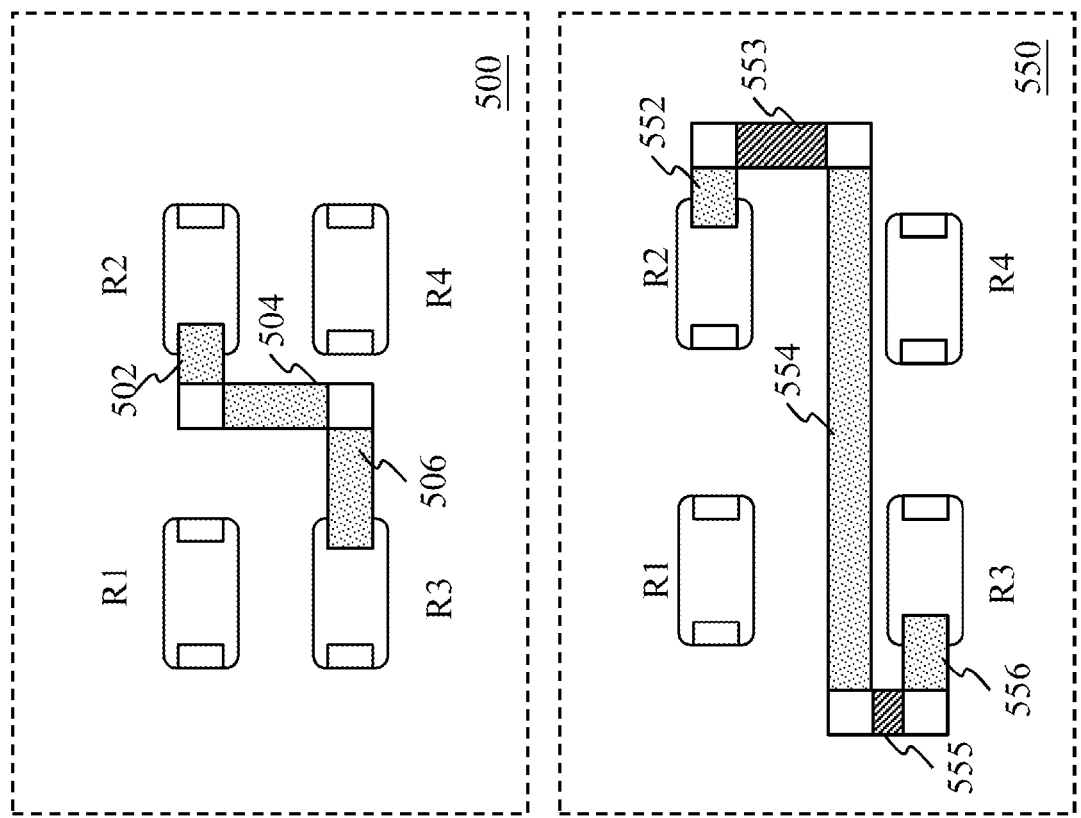
FIG. 5 illustrates a method of adjusting the resistance of a semiconductor resistor structure in accordance with another embodiment.
Figure 6:
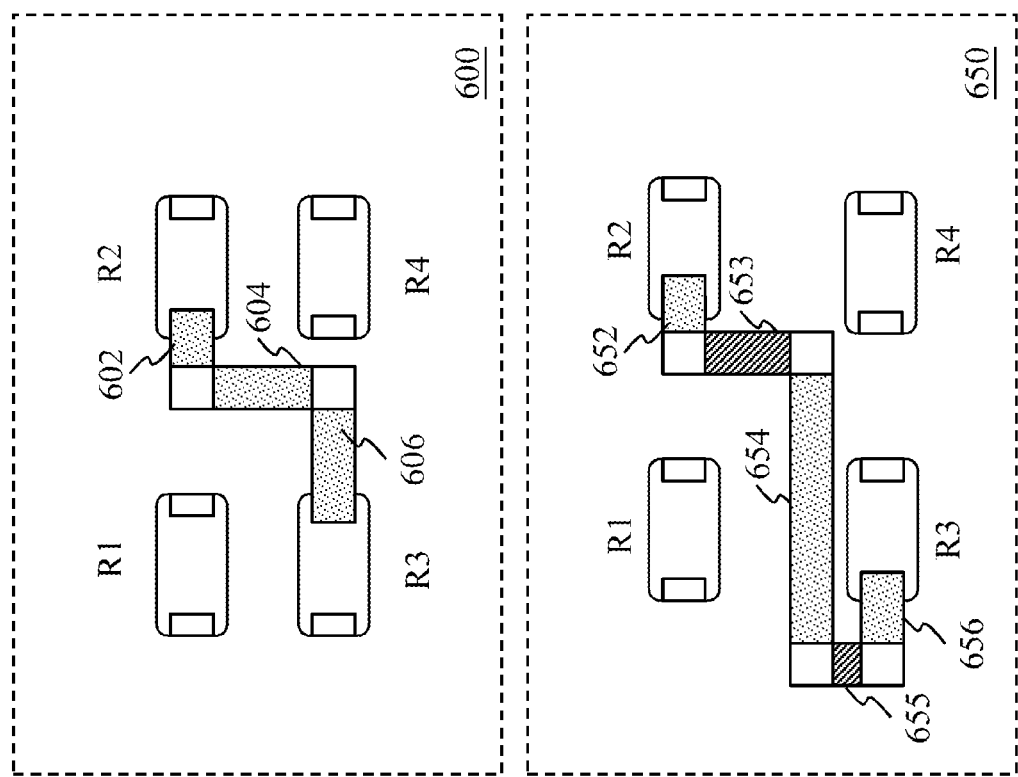
FIG. 6 illustrates a method of adjusting the resistance of a semiconductor resistor structure in accordance with yet another embodiment.

FIG. 3B illustrates a flowchart of performing a V/I test in accordance with various embodiments of the present disclosure. At step 305, two nodes (e.g., A1 and B1 shown in FIG. 3A) may be selected from various nodes of a circuit. At step 310, a V/I test may be performed on the nodes A1 and B1 through suitable simulation tools such as HSPICE, SPECTRE, ELDO, BERKELEY SPICE, FINESIM and/or the like. At step 320, the equivalent resistance between A1 and B1 is extracted from the simulation tool. At step 330, the equivalent resistance is back-annotated to the SPF file (e.g., SPF file shown in FIG. 2) and a mismatch between two critical resistors may be detected. In order to reduce the mismatch, an interconnect modification mechanism may be employed to adjust the equivalent resistance between two nodes. FIGS. 4-6 illustrate a variety of methods of adjusting the resistance of a selected semiconductor resistor structure.

FIG. 4 illustrates a method of adjusting the resistance of a semiconductor resistor structure in accordance with an embodiment. A first semiconductor resistor structure 400 includes two semiconductor resistors R1 and R2. As shown in FIG. 4, the semiconductor resistors R1 and R2 are connected in series through a plurality of interconnects. The interconnects may include first metal layer interconnects 402, 404 and 406 and second metal layer interconnects 408 and 410. As shown in FIG. 4, the interconnect 406 is of a width Y and a length X. The total resistance of the first semiconductor resistor structure 400 is equal to the sum of R1, R2 and parasitic resistance contributed by the interconnects.

A second semiconductor resistor structure 450 is of a structure similar to that of the first semiconductor resistor structure 400 except that the interconnect 406 is replaced by a longer and wider interconnect. According to an embodiment, the resistance of an interconnect is proportional to a length of the interconnect and inversely proportional to a width of the interconnect. As such, by adjusting either the width or the length of an interconnect, the total resistance may change accordingly.

As shown in FIG. 4, the second semiconductor resistor structure 450 is of a longer and wider interconnect, which is formed by interconnects 455, 456 and 457. The length of the interconnect is equal to 2X and the width of the interconnect is equal 2Y. As such, the total resistance from the interconnect is approximately equal to that of the interconnect 406. As a result, the total resistance of the first semiconductor structure 400 is approximately equal to the total resistance of the second semiconductor structure 450.

One advantageous feature of having the method shown in FIG. 4 is that the mismatch can be compensated by using different interconnect structures. For example, the equivalent resistance can be adjusted by using different number of vias or different interconnect layers.

FIG. 5 illustrates a method of adjusting the resistance of a semiconductor resistor structure in accordance with another embodiment. A first semiconductor resistor structure 500 includes four semiconductor resistors R1, R2, R3 and R4. As shown in FIG. 4, R1, R2, R3 and R4 are placed in rows and columns. The semiconductor resistors R2 and R3 are connected in series through a plurality of interconnects. The interconnects may include first metal layer interconnects 502, 504 and 506.

A second semiconductor resistor structure 550 is of a structure similar to that of the first semiconductor resistor structure 500 except that the placement of the interconnects has been adjusted so that a longer interconnect 554 is employed to couple R2 and R3 together. In addition, in order to adjust the placement, two second metal layer interconnects 553 and 555 are used to connect R2 and R3. As shown in FIG. 5, the longer interconnect 554 helps to increase the total resistance of the second semiconductor resistor structure 550.

FIG. 6 illustrates a method of adjusting the resistance of a semiconductor resistor structure in accordance with yet another embodiment. The interconnect placement shown in FIG. 6 is similar to that shown in FIG. 5, and hence is not discussed in detail to avoid repetition.

Figure 7:
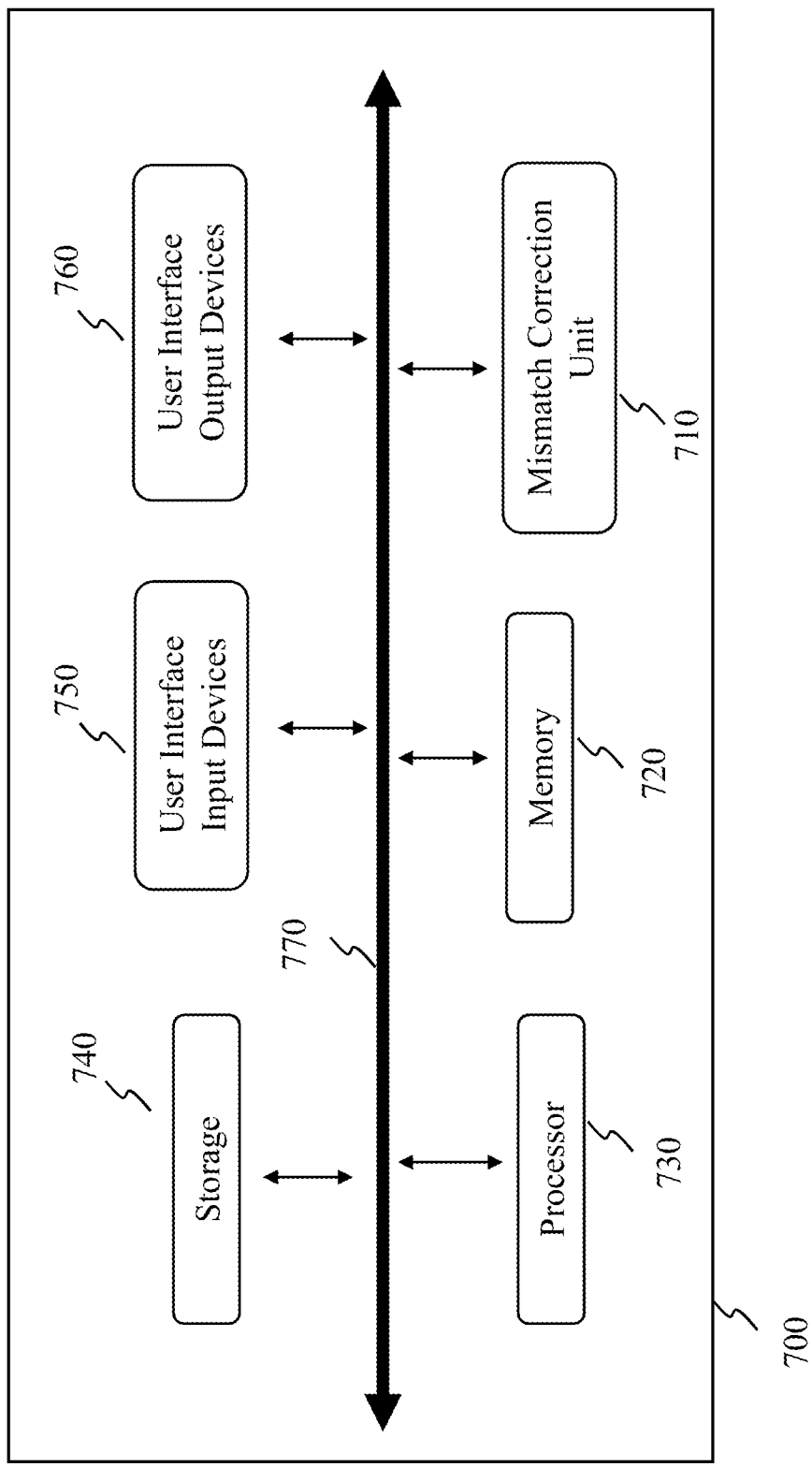
FIG. 7 illustrates a simplified block diagram of a computer system that can be used to implement the method shown in FIG. 1 in accordance with an embodiment.

FIG. 7 illustrates a simplified block diagram of a computer system that can be used to implement the method shown in FIG. 1 in accordance with an embodiment. The computer system 700 includes a mismatch correction unit 710, a memory 720, a processor 730, a storage unit 740, user interface input devices 750, user interface output devices 760 and a data bus 770. It should be noted that this diagram is merely an example of a general purpose computer, which should not unduly limit the scope of the claims. Many other configurations of a computer are within the scope of this disclosure. One of ordinary skill in the art would also recognize the mismatch correction method may be performed by other computer systems including a portable computer, a workstation, a network computer, or the like.

The mismatch correction unit 710 may be a physical device, a software program, or a combination of software and hardware such as Application Specific Integrated Circuits (ASIC). In accordance with an embodiment, when a user launches the mismatch correction method through the user interface input devices 750, the processor 730 loads the layout and other relevant information from the storage unit 740. According to an embodiment, the mismatch correction method is implemented as a software program, the processor 730 loads the software program from the mismatch correction unit 710 and operates it in the memory 720. After the processor 730 performs each step of FIG. 1, the processor 730 sends the final layout to the user interface output devices 760.

Figure 8:
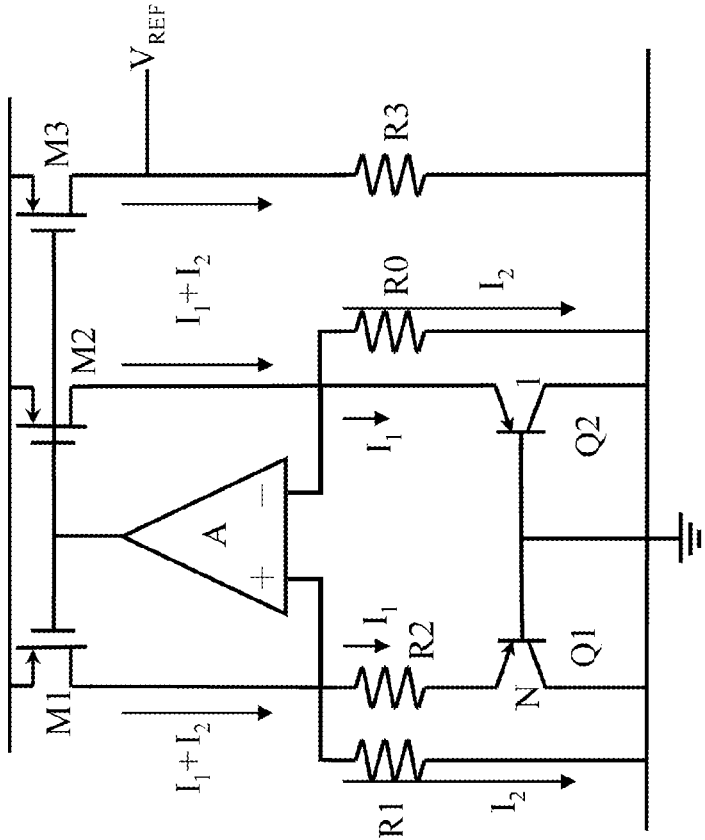
FIG. 8 illustrates a schematic diagram of a band gap reference circuit in accordance with various embodiments of the present disclosure.

FIG. 8 illustrates a schematic diagram of a band gap reference circuit in accordance with various embodiments of the present disclosure. The band gap reference circuit 800 includes a plurality of current sources (e.g., $I_1$ and $I_2$ as shown in FIG. 8). Resistors R1 and R2 are employed to control the accuracy of the band gap reference circuit 800. In order to maintain a highly accurate band gap reference, the ratio between R1 and R2 may be kept constant under various operating conditions. The detailed operation principle of the band gap reference circuit 800 is well known in the art, and hence is not discussed herein.

In accordance with an embodiment, a method comprises generating a first net list file from a first layout through a resistance-inductance-capacitance (RLC) extraction mechanism using a first simulation tool, performing a V/I test on a network through a second simulation tool, determining whether a mismatch exists based upon a result of the V/I test and modifying a connection trace of the network to generate a second layout.

In accordance with another embodiment, a method comprises setting a first ratio between a first resistor structure and a second resistor structure through a pre-layout simulation, placing the first resistor structure and the second resistor structure into a layout and generating a net list file including parasitic parameters of the first resistor structure and the second resistor structure. The net list file comprises resistance values of the first resistor structure and the second resistor structure and X-Y coordinates of the first resistor structure and the second resistor structure.

The method further comprises performing a first V-I test on the first resistor structure through a simulation tool to obtain a first resistance value, performing a second V-I test on the second resistor structure through the simulation tool to obtain a second resistance value, determining whether a mismatch exists between a second ratio based upon the V-I test and the first ratio and modifying the layout including the first resistor structure and the second resistor structure.

In accordance with yet another embodiment, a computer program comprises computer program code for generating a first net list file from a first layout through a resistance-inductance-capacitance (RLC) extraction mechanism using a first simulation tool, computer program code for performing a V/I test on a network through a second simulation tool, computer program code for determining whether a mismatch exists based upon a result of the V/I test and computer program code for modifying a connection trace of the network to generate a second layout.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method comprising:
generating, by a processor, a first net list file from a first layout through a resistance-inductance-capacitance (RLC) extraction mechanism using a first simulation tool, wherein the first layout includes a plurality of resistors and the first net list file includes a resistance ratio of a first resistor to a second resistor;
performing a voltage/current (V/I) test on a network through a second simulation tool, wherein the network includes the first resistor and the second resistor and a plurality of connection traces;
determining whether a resistance ratio mismatch exists based upon a result of the V/I test; and
modifying a connection trace of the network to generate a second layout based upon the resistance ratio mismatch.

2. The method of claim 1, further comprising:
receiving a plurality of component models from an IC foundry; and
generating the first net list file based upon the component models.

3. The method of claim 1, wherein:
the second simulation tool is configured to analyze electrical characteristics of a node of the first layout; and
the first simulation tool is configured to extract interconnect parasitic components of the first layout.

4. The method of claim 1, further comprising:
selecting two nodes from the first layout;
performing the V/I test on the nodes;
extracting an equivalent resistance value; and
detecting the mismatch through a back-annotation process.

5. The method of claim 1, further comprising:
after the step of modifying the connection trace of the network to generate the second layout, generating a second net list file from the second layout through the resistance-inductance-capacitance (RLC) extraction mechanism using the first simulation tool; and
performing the V/I test on the network through the second simulation tool.

6. The method of claim 1, further comprising:
after the step of determining whether the mismatch exists based upon the result of the V/I test, modifying a width of the connection trace of the network to generate the second layout.

7. The method of claim 1, further comprising:
after the step of determining whether the mismatch exists based upon the result of the V/I test, modifying a length of the connection trace of the network to generate the second layout.

8. The method of claim 1, further comprising:
performing a design rule check (DRC) test on the first layout; and
performing a layout versus schematic (LVS) test on the first layout.

9. The method of claim 1, wherein the first net list file comprises:
coordinates of four corners of a resistor having a rectangular shape in the first layout;
a width of the resistor; and
a length of the resistor.

10. The method of claim 9, further comprising:
a location of the resistor in the first layout; and
a resistance value of the resistor.

11. A method comprising:
setting a first ratio between a first resistor structure and a second resistor structure through a pre-layout simulation;
placing the first resistor structure and the second resistor structure into a layout;
generating, by a processor, a net list file including parasitic parameters of the first resistor structure and the second resistor structure, wherein the net list file comprises:
resistance values of the first resistor structure and the second resistor structure; and
X-Y coordinates of the first resistor structure and the second resistor structure;
performing a first voltage-current (V-I) test on two nodes of the first resistor structure through a simulation tool to obtain a first resistance value across the two nodes of the first resistor structure;
performing a second V-I test on two nodes of the second resistor structure through the simulation tool to obtain a second resistance value across the two nodes of the second resistor structure;
determining whether a mismatch exists between a second ratio based upon the V-I test and the first ratio; and
modifying the layout including the first resistor structure and the second resistor structure based upon the mismatch.

12. The method of claim 11, further comprising:
after the step of determining whether the mismatch exists between the second ratio based upon the V-I test and the first ratio, modifying a width of an interconnect of the first resistor structure.

13. The method of claim 11, further comprising:
after the step of determining whether the mismatch exists between the second ratio based upon the V-I test and the first ratio, modifying a length of an interconnect of the first resistor structure.

14. The method of claim 11, further comprising:
after the step of modifying the layout including the first resistor structure and the second resistor structure, generating a second net list file based upon a modified layout;
performing a third V-I test to calculate a third ratio between the first resistor structure and the second resistor structure; and
determining whether a mismatch exists between the third ratio and the first ratio.

15. The method of claim 11, wherein:
the first resistor structure includes a plurality of semiconductor resistors formed in/on a substrate and connectors formed in interconnect layers over the substrate; and
the second resistor structure includes a plurality of semiconductor resistors formed in/on the substrate and connectors formed in the interconnect layers over the substrate.

16. The method of claim 11, further comprising:
after the step of placing the first resistor structure and the second resistor structure into the layout, performing a design rule check (DRC) test on the layout;
performing a layout versus schematic (LVS) test on the layout;
receiving a plurality of component models from an IC foundry; and
generating the net list file using a resistance extraction tool.

17. A computer program product having a non-transitory computer-readable medium with a computer program embodied thereon, the computer program comprising:
computer program code for generating a first net list file from a first layout through a resistance-inductance-capacitance (RLC) extraction mechanism using a first simulation tool, wherein the first layout includes a plurality of resistors and the first net list file includes a resistance ratio of a first resistor to a second resistor;
computer program code for performing a voltage/current (V/I) test on a network through a second simulation tool, wherein the network includes the first resistor and the second resistor and a plurality of connection traces;
computer program code for determining whether a resistance ratio mismatch exists based upon a result of the V/I test; and
computer program code for modifying a connection trace of the network to generate a second layout based upon the resistance ratio mismatch.

18. The computer program product of claim 17, further comprising:
computer program code for after the step of modifying the connection trace of the network to generate the second layout, generating a second net list file from the second layout through the resistance-inductance-capacitance (RLC) extraction mechanism using the first simulation tool; and
computer program code for performing the V/I test on the network through the second simulation tool.

19. The computer program product of claim 17, further comprising:
computer program code for setting a first ratio between a first resistor structure and a second resistor structure through a pre-layout simulation;
computer program code for placing the first resistor structure and the second resistor structure into a layout;
computer program code for generating a net list file including parasitic parameters of the first resistor structure and the second resistor structure, wherein the net list file comprises:
resistance values of the first resistor structure and the second resistor structure; and
X-Y coordinates of the first resistor structure and the second resistor structure;
computer program code for performing a first V-I test on the first resistor structure through a simulation tool to obtain a first resistance value;
computer program code for performing a second V-I test on the second resistor structure through the simulation tool to obtain a second resistance value;
computer program code for determining whether a mismatch exists between a second ratio based upon the V-I test and the first ratio; and
computer program code for modifying the layout including the first resistor structure and the second resistor structure.

20. The computer program product of claim 19, further comprising:
computer program code for after the step of modifying the layout including the first resistor structure and the second resistor structure, generating a second net list file based upon a modified layout;
computer program code for performing a third V-I test to calculate a third ratio between the first resistor structure and the second resistor structure; and computer program code for determining whether a mismatch exists between the third ratio and the first ratio.

* * * * *